(12) United States Patent
Zimmerman et al.

(10) Patent No.: US 7,321,997 B2
(45) Date of Patent: Jan. 22, 2008

(54) MEMORY CHANNEL SELF TEST

(75) Inventors: David Zimmerman, El Dorado Hills, CA (US); Edward Weaver, Sunnyvale, CA (US); Ramasubramanian Rajamani, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 303 days.

(21) Appl. No.: 10/815,217

(22) Filed: Mar. 30, 2004

(65) Prior Publication Data

US 2005/0223303 A1 Oct. 6, 2005

(51) Int. Cl.
G11C 29/00 (2006.01)
G01R 31/28 (2006.01)

(52) U.S. Cl. ...................... 714/718; 714/724
(58) Field of Classification Search ........ 714/718–723; 710/306–308
See application file for complete search history.

(56) References Cited

U.S. PATENT DOCUMENTS 5,561,672 A * 10/1996 Kaneko ...................... 714/805
5,852,617 A * 12/1998 Mote, Jr. .................... 714/726
5,875,195 A * 2/1999 Dixon ........................ 714/719
6,502,161 B1 * 12/2002 Perego et al. ................. 711/5
6,771,087 B1 * 8/2004 Oz et al. ..................... 324/763
2002/0056062 A1 * 5/2002 Hartmann ................... 714/719
2002/0125879 A1 * 9/2002 Lee et al. ................. 324/158.1
2003/0041086 A1 * 2/2003 Lankreijer .................. 709/102

* cited by examiner

Primary Examiner—Cynthia Britt
Assistant Examiner—Saqib Siddiqui
(74) Attorney, Agent, or Firm—Racheol Wu

(57) ABSTRACT

A buffer logic within a memory module having the capability to carry out a test of another memory module to which it is coupled via a point-to-point bus through autonomously storing and transmitting a test pattern across that point-to-point bus to the other memory module, while further employing another buffer logic that is interposed between the two memory modules to pass on the test pattern, but intercept a signal received from the other memory module during the test and pass on an indication of the receipt of that signal to an analysis device to monitor the test.

13 Claims, 7 Drawing Sheets

MEMORY CHANNEL SELF TEST

BACKGROUND

As processors have continued to advance in performance at a rampant pace, DRAM-based memory systems have largely not been able to keep up. Various efforts have been made to improve both the speed of the memory cells making up DRAM components and to improve the apparent speed of access to arrays of DRAM components by accessing arrays with ever wider memory busses. However, wider busses require greater quantities of electrical connections, i.e., a wider memory, to transfer data, so more recent efforts have focused on providing memory buffer logic that provides a wider memory bus connecting to the memory devices of a memory array, but which converts from that wider memory bus to a narrower memory bus that may be connected to other components of a memory system (e.g., a memory controller, or memory buffer logic connected to other memory arrays) so that such other components need not be designed to support a connection to as wide a memory bus.

To keep pace with data throughput made possible with the ever wider buses connecting to the memory devices of memory arrays, a form of memory buffer logic has been considered employing narrow memory buses connecting to other memory system components in point-to-point buses (i.e., a "daisy chain" topology of bus connections), rather than the more widely used multi-drop topology, to better support differential signaling and other techniques to allow for higher transfer rates.

Unfortunately, the use of such a combination of memory buffer logic and point-to-point buses adds difficulties to development and test efforts. The fact that a conversion takes place between a wider bus and a narrow bus for every memory array that is provided in a memory system requires that provision be made for testing such conversions. Also, the use of point-to-point buses often requires the monitoring of signals across such point-to-point buses to be accomplished by breaking into the point-to-point connections to carry out testing.

DETAILED DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

Embodiments of the present invention concern incorporating support within memory buffer logic for testing memory other memory components making up a memory system. Although the following discussion centers on computer systems, it will be understood that embodiments of the claimed invention may be practiced in support of a number of different types of electronic devices employing various possible forms of memory system components.

Figure 1:
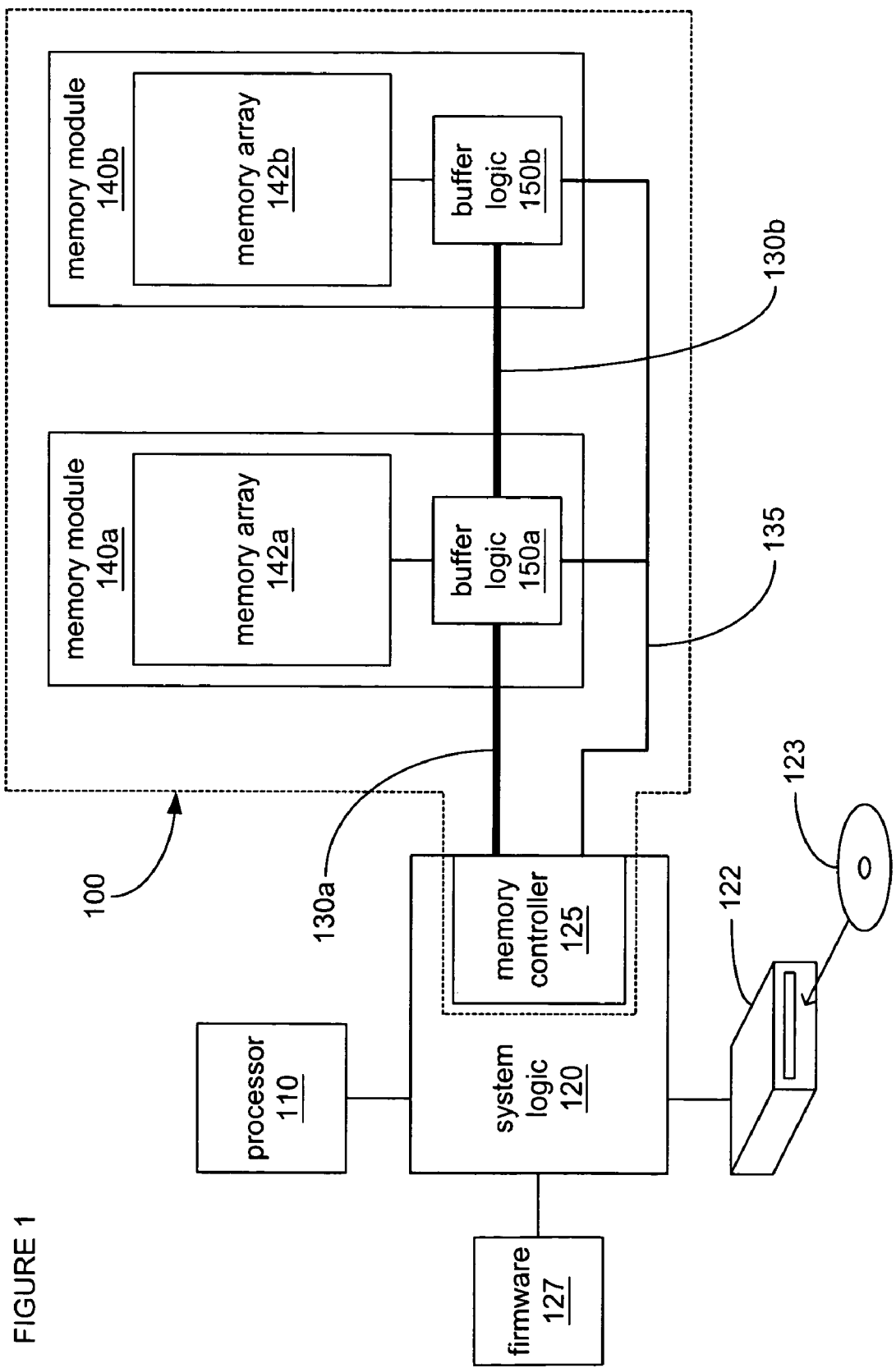
FIG. 1 is a block diagram of an embodiment employing a memory system.

FIG. 1 is a simplified block diagram of an embodiment employing a memory system. Memory system 100 is made up, at least in part, of memory controller 125, memory modules 140a and 140b, point-to-point bus 130a connecting memory controller 125 to memory module 140a, point-to-point bus 130b connecting memory module 140a to memory module 140b, and possibly by configuration bus 135 connecting together all three of memory modules 140a and 140b, and memory controller 125. Memory modules 140a and 140b provide random access storage space for the storage and retrieval of data under the control of memory controller 125. Also depicted in FIG. 1 are other components outside of memory system 100 that, along with memory system 100, make up at least a portion of a computer system, including processor 110 connected to system logic 120, and possibly also firmware 127 and/or storage device 122 that also connect to system logic 120.

Memory controller 125 controls many of the functions carried out by memory system 100 as part of providing access to memory modules 140a and 140b to another device that is either coupled to memory controller 125 or into which memory controller 125 is incorporated (such as system logic 120, as depicted in FIG. 1). Specifically, another device (such as system logic 120 on behalf of processor 110) issues commands to memory controller 125 to store data within and/or to retrieve stored data from one or both of memory modules 140a and 140b. Point-to-point buses 130a and 130b provide a daisy chain topography of connections between memory controller 125 and both of memory modules 140a and 140b such that addresses, commands and/or data transmitted by memory controller 125 and directed towards memory module 140b will actually be received by memory module 140a and then retransmitted to memory module 140b. So, memory controller 125 receives commands from another device and relays them to memory module 140a in a format having timing and protocols compatible with point-to-point bus 130a, and whichever ones of those commands are actually directed at memory module 140b are relayed onward towards memory module 140b through point-to-point bus 130b. In effect, memory controller 125 coordinates accesses made to memory cells (e.g., 1-transistor or 2-transistor DRAM memory cells, 4-transistor or 6-transistor SRAM memory cells, etc.) within memory arrays 142a and 142b of memory modules 140a and 140b, respectively, in answer to read and write commands from external devices. In support of these functions in various embodiments, and depending on various characteristics of memory modules 140a and 140b, memory controller 125 also coordinates various maintenance operations that must be performed to ensure that data stored within memory modules 140a and 140b is preserved, including the initiation of regular refresh operations, occurrence of precharge operations, etc.

In some embodiments, point-to-point buses 130a and 130b are of a dual simplex configuration in which there are separate signal lines transmitting addresses, commands and/or data in each direction along each of point-to-point buses 130a and 130b. In such embodiments, transmissions from memory controller 125 and going towards memory module 140*b* (i.e., the memory module furthest away from memory controller 125 in the daisy chain of point-to-point connections) are referred to as "Southbound" transmissions, while transmissions from either of memory modules 140*a* or 140*b* towards memory controller 125 are referred to as "Northbound" transmissions. Also, in various embodiments, configuration bus 135 is a 2-wire serial bus of a type widely known and used in applications to read configuration data and program configuration registers, such as I²C (™ of Philips Semiconductor), Access.bus, SMBus, or any of a variety of other buses employing a relatively small number of signal lines.

Memory module 140*a* is made up, at least in part, of buffer logic 150*a* and memory array 142*a*, coupled together within memory module 140*a*. Buffer logic 150*a* provides memory module 140*a* with interfaces for at least two point-to-point buses, namely point-to-point bus 130*b* to couple with buffer logic 150*b* of memory module 140*b*, and point-to-point bus 130*a* to couple with memory controller 125 of system logic 120 (provided that system logic 120 is present and memory controller 125 is incorporated into system logic 120). Buffer logic 150*a* also, in effect, serves as a form of simple memory controller insofar as buffer logic 150*a* provides a memory interface by which buffer logic 150*a* is coupled to memory array 142*a*, with that memory interface providing support for timings and protocols to support making read and write accesses to memory cells within memory array 142*a*. Memory array 142*a* is made up of memory devices, such as DRAM ICs, arranged to provide at least one array of memory cells into which data may be stored or from which data may be retrieved as coordinated by the memory controller functions provided by buffer logic 150*a*. Memory module 140*b* is largely similar to memory module 140*a*, in that analogous to memory module 140*a*, memory module 140*b* is made up, at least in part, of buffer logic 150*b* and memory array 142*b*, coupled together within memory module 140*b*. Buffer logic 150*b*, in addition to providing a memory interface to memory array 142*b*, provides memory module 140*b* with interfaces for at least two point-to-point buses, namely point-to-point bus 130*b* and what would be another point-to-point bus were there another memory system component, such as another memory module, also connected to memory module 140*b*. There could also be differences between memory modules 140*a* and 140*b*, such as memory arrays 142*a* and 142*b* being of different capacities or permitting access to data at differing rates, however such differences are possible without departing from the spirit and scope of the claimed invention.

In some embodiments, memory modules 140*a* and 140*b* are constructed from a miniature circuitboard to which are attached multiple integrated circuits, including buffer logics 150*a* and 150*b*, respectively, and memory ICs making up memory arrays 142*a* and 142*b*, respectively. Such circuitboards may designed with conductors arrayed along one edge to provide support for attachment via an edge connector such that memory modules 140*a* and 140*b* are designed to be DIMMs (dual inline memory modules) for use with DIMM connectors attached to another circuitboard. Such other circuitboard may be one to which memory controller 125 (or perhaps, system logic 120 into which memory controller 125 may be incorporated) is also attached. In alternate embodiments, memory modules 140*a* and 140*b* are made up of multiple integrated circuits attached to a circuitboard configured to be a SIMM (single inline memory module), SIPP (single inline pin package), enclosed PC Card, etc.

Memory arrays 142*a* and 142*b* may be made of a number of possible types of memory IC, and although much of the discussion herein focuses on the use of DRAM ICs, it will be understood that memory devices of other technologies, including static RAM, FLASH, various forms of read-only memory, etc., may be used. The fact that buffer logics 150*a* and 150*b* convert between a memory bus used to interface to memory arrays 142*a* and 142*b*, and other buses grants considerable freedom in selecting the type of memory bus used such that the type of memory interface and/or bus used between buffer logic 150*a* and memory array 142*a* may be different from the type of memory interface and/or bus used between buffer logic 150*b* and memory array 142*b*. Some possible memory buses that may be employed in various embodiments include SDR (single data rate) synchronous DRAM bus, DDR (double data rate) synchronous DRAM bus, RAMBUS (a ™ of RAMBUS), etc.

At various possible times in the operation of memory system 100, such as following being powered up or upon encountering an indication of a memory error, one or the other of buffer logics 150*a* or 150*b* may autonomously carry out one or more tests of other components of memory system 100. Specifically, by way of example in some embodiments, buffer logic 150*a* may carry out various tests of memory module 140*b* (testing either buffer logic 150*b* or memory array 142*b*) through the transmission of various commands and/or data across point-to-point bus 130*b* to test memory module 140*b* by eliciting action and/or a response. To do this, buffer logic 150*a* may generate a test pattern incorporating such test commands and/or test data from an algorithm either designed into buffer logic 150*a*, or alternatively, buffer logic 150*a* may receive such a test pattern (or commands for generating a test pattern) from across either point-to-point bus 130*a* or configuration bus 135 from memory controller 125 and/or other devices (not shown). It may be that such a test pattern is intended to put memory module 140*b* through normal operation, perhaps storing and/or retrieving data to verify such functionality. However, it may be that such a test pattern incorporates one or more deliberate errors in commands and/or other forms of information intended to provoke a response to such errors, perhaps to verify error handling functionality of memory module 140*b*, such as responding with an error message, rejecting or ignoring errant commands, etc. In some variations, buffer logic 150*a* may receive a response from memory module 140*b* possibly indicating the results of a test, or in other variations, another device, such as memory controller 125, may be the recipient of such a response.

In embodiments in which memory controller 125 provides test patterns and/or a test algorithm to buffer logic 150*a* to enable buffer logic 150*a* to carry out such tests of memory module 140*b*, memory controller 125 may receive such test patterns, commands for generating test patterns and/or algorithms from firmware 127 or storage device 122, through system logic 120, and possibly under the control of processor 110. In some variations, test patterns either received or generated by buffer logic 150*a* may be first stored in memory array 142*a* as a way of queuing the patterns in preparation for more efficiently transmitting the patterns to memory module 140*b* as a packet or stream, especially where buffer logic 150*a* receives test patterns via configuration bus 135 and configuration bus 135 has a maximum data transfer rate that is far slower than that of point-to-point bus 130*b*. It may be, in embodiments where memory controller 125 provides test patterns and/or commands to buffer logic 150*a* to generate test patterns, that the conducting of such tests by buffer logic 150*a* is part of an initialization or self-test procedure carried out by the computer system of which memory system 100, processor 110 and system logic 120 may be a part. Such testing of memory module 140b by buffer logic 150a may have advantages over tests carried out by memory controller 125, such as aiding in isolating the source of a memory error. Such testing may also be needed to test features within memory module 140b and/or forms of interaction between memory modules 140a and 140b that memory controller 125 does not, itself, support directly, and therefore cannot test, itself. In some embodiments, buffer logics 150a and 150b are substantially similar in function with buffer logic 150a possibly incorporating additional test logic (not shown) to carry out tests as just described, while in other embodiments, buffer logics 150a and 150b are substantially identical in both design and function with both buffer logics 150a and 150b incorporating test logic such that either are capable of carrying out tests as just described.

Figure 2:
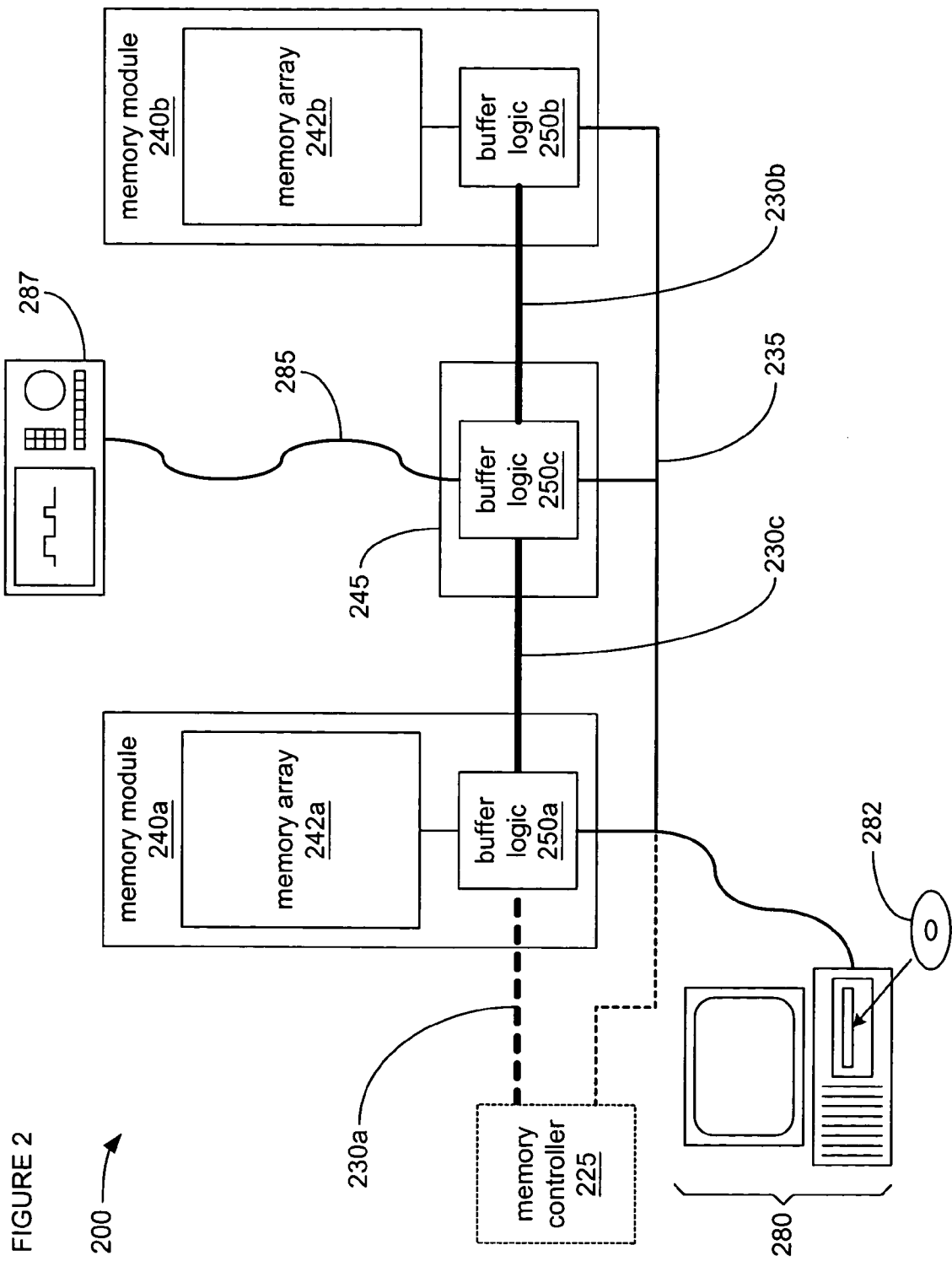
FIG. 2 is a block diagram of an embodiment employing a test assembly with multiple memory modules.

FIG. 2 is a simplified block diagram of an embodiment employing a test assembly. Test assembly 200 is made up, at least in part, of analysis module 245, analysis device 287, memory modules 240a and 240b, test source 280, point-to-point bus 230c connecting memory module 240a to analysis module 245, point-to-point bus 230b connecting analysis module 245 to memory module 240b, analysis link 285 connecting analysis module 245 to analysis device 287, and configuration bus 235 connecting together memory modules 240a and 240b, analysis module 245 and test source 280. In some embodiments, test assembly 200 may be further made up of memory controller 225 and point-to-point bus 230a to connect memory controller 225 to memory modules 240a, especially if memory modules 240a and 240b, along with memory controller 225, make up part of a memory system of a computer system (not shown) in a manner not unlike memory system 100 of FIG. 1. In such embodiments, memory controller 225 may also be connected to configuration bus 235. However, in other embodiments and as hinted by the use of dotted lines to depict memory controller 225 and point-to-point bus 230a, neither memory controller nor point-to-point bus 230a is present, and test assembly 200 thereby does not also assume the additional role of a memory system of a computer system. Also, though not shown, one or more additional memory modules may be coupled to buffer logic 250b in a manner that continues the "daisy chain" configuration of point-to-point buses already started with point-to-point buses 230a and 230b.

In some embodiments, point-to-point buses 230b and 230c (and also 230a, if present) are of a dual simplex configuration in which there are two separate sets of signal lines, one set transmitting addresses, commands and/or data in one direction along each of point-to-point buses 230a-c, and another set transmitting addresses, commands and/or data in the other direction. In such embodiments, transmissions along the daisy chain of point-to-point buses 230a-c in a direction away from memory controller 225 (if present) and going towards memory module 240b are referred to as "Southbound" transmissions, while transmissions in a direction towards memory controller 225 (again, if present) are referred to as "Northbound" transmissions. Also, in some embodiments, configuration bus 235 is a two-wire serial bus of a type widely known and used in reading configuration data and programming configuration registers.

In a manner substantially similar to memory modules 140a and 140b of FIG. 1, memory modules 240a and 240b are made up, at least in part, of buffer logics 250a and 250b, respectively, coupled together with memory arrays 242a and 242b within memory modules 240a and 240b, respectively. As was the case with buffer logics 150a and 150b, buffer logics 250a and 250b, in addition to providing some degree of memory control functionality for coupling with memory arrays 242a and 242b, respectively, provide memory modules 240a and 240b with interfaces for at least two point-to-point buses, and both memory arrays 242a and 242b are each made up of memory devices, such as DRAM ICs, arranged to provide at least one array of memory locations into which data may be stored. There could also be differences between memory modules 240a and 240b, such as memory arrays 242a and 242b being of different capacities or permitting access to data at differing rates, however such differences are possible without departing from the spirit and scope of the claimed invention.

Not unlike memory modules 140a and 140b of FIG. 1, in some embodiments, memory modules 240a and 240b are constructed from a miniature circuitboard to which are attached multiple integrated circuits, including buffer logics 250a and 250b, respectively, and memory ICs making up memory arrays 242a and 242b, respectively. Such circuitboards may designed with conductors arrayed along one edge such that memory modules 240a and 240b are designed to be DIMMs, SIMMs, SIPPs, etc. Also, in various embodiments, memory arrays 242a and 242b may be made of a number of possible types of memory IC.

Analysis module 245 is made up, at least in part, of buffer logic 250c, providing an interface to analysis link 285, which in turn, connects analysis module 245 to analysis device 287. Not unlike buffer logics 250a and 250b of memory modules 240a and 240b, buffer logic 250c provides analysis module with interfaces for at least two point-to-point buses, namely point-to-point buses 230c and 230b such that buffer logic 250c is interposed between buffer logics 250a and 250b, and passes through communication from buffer logic 250a to buffer logic 250b, and possibly, passes through communication from buffer logic 250b to buffer logic 250a. In some embodiments, analysis device 287 receives at least some indications and/or at least some sampling of communications between buffer logics 250a and 250b, as captured and relayed to analysis device 287 by buffer logic 250c.

Regardless of whether memory controller 225 and both memory modules 240a and 240b are assembled together to form a memory system for a computer system, or whether memory controller 225 is not present and memory modules 240a and 240b are assembled together solely for purposes of testing, at some point during use of testing assembly 200, buffer logic 250a of memory module 240a transmits a test pattern to memory module 240b across both point-to-point buses 230c and 230b, as well as through buffer logic 250c within analysis module 245 as part of initiating a test of memory module 240b. In some embodiments, buffer logic 250a may generate the transmitted test pattern internally, employing an algorithm designed into buffer logic 250a to create one or more test patterns, or in alternate embodiments, buffer logic 250a may receive a test pattern and/or commands for creating a test pattern from an external device, such as test source 280 through configuration bus 235. Such testing of memory module 240b by buffer logic 250a may have advantages over tests that might possibly be carried out by memory controller 225, particularly in a development effort where perhaps a desired version of memory controller 225 is not available or is otherwise unable to carry out such tests. Such testing may also be needed to test features within memory module 240b and/or forms of interaction between memory modules 240a and

240b that memory controller 225 could not, itself, test directly, regardless of whether or not memory controller 225 is present.

In various embodiments, regardless of whether buffer logic 250a receives a test pattern or generates a test pattern internally, buffer logic 250a may store part or all of a test pattern within memory array 242a, thereby using memory array 242a as a buffer to queue the test pattern in preparation for transmitting the test pattern to memory module 240b in a stream or packet at a high transfer rate. Such buffering of a test pattern may be necessary if the rate at which the test pattern is able to be received from test source 280 or generated from within buffer logic 250a is too slow to keep pace with a desired transfer rate across point-to-point buses 230c and 230b. Still, in spite of such use of memory array 242a in buffering a test pattern, there may still be a need to insert no-op instructions among test instructions and/or null data among pieces of test data incorporated within the test pattern as the test pattern is transmitted to memory modules 240b in embodiments where characteristics of memory array 242a may impose delays in retrieving some or all of a test pattern from memory array 242a for transmission as a result of a need by memory array 242a to be supported with refresh operations, etc. In such instance where no-op commands and/or null data may be inserted, and especially where a test pattern is transmitted as one or more packets with a cyclic redundancy check (CRC) or other transmission error detection algorithm, logic within buffer logic 250a may update and/or recalculate one or more values or other error detection/correction information used in detecting and/or correcting transmission errors to accommodate inserted no-op commands and/or null data (i.e., logic within buffer logic 250a may recalculate a CRC value). Alternatively, it may be that characteristics of the insertion of no-op commands and/or null data, and/or characteristics of the error detection/correction algorithm used may make such a recalculation or other updating of one or more error detection/correction values or flags unnecessary (e.g., a piece of null data or a no-op command may be in a form, such as all zero bits, that does not alter an error detection/correction value or flag, and therefore, renders such a recalculation or updating unnecessary).

In some embodiments, test source 280 may be a computer system attached to configuration bus 235 (as depicted) and may load test patterns and/or commands for generating test patterns from storage media 282 to be provided to buffer logic 250a. In such embodiments, such a computer system may use a serial interface common to and in wide use by general purpose computer systems, such as RS-232C or USB, to interface with configuration bus 235, possibly through either a signal level or protocol converter. In other embodiments, test source 280 may be one or more testing devices specifically designed to serve the roll of controlling a test and/or providing test patterns. In still other embodiments, test source 280 may be a simple nonvolatile storage device, such as an EPROM, into which a test pattern and/or a commands for generating a test pattern were previously stored for later use with test assembly 200. Such a nonvolatile storage device may internally incorporate a two-wire serial interface that would be able to directly connect with embodiments in which configuration bus 235 is implemented as such a two-wire serial interface, as previously discussed.

In some embodiments, analysis device 287 is a logic analyzer, oscilloscope, or any of a variety of possible analysis, diagnostics and/or test equipment with which those skilled in the art will be readily familiar. However, in other embodiments, analysis device 287 may be a storage device to simply capture and record events and/or other data concerning the execution of one or more tests for later playback and analysis. Also, in some embodiments, analysis device 287 and test source 280 are actually the same device, thereby allowing the same device to both provide test patterns and/or commands to buffer logic 250a with which to carry out tests and receive results of those tests from buffer logic 250c. In other embodiments, some indication of results of tests may be received by buffer logic 250a to be relayed to test source 280 via configuration bus 235, perhaps as a way to trigger the transmission by test source 280 of another test pattern and/or commands to buffer logic 250a. Furthermore, although the discussion of testing with regard to FIG. 2 has centered on tests of only memory module 240b carried out by buffer logic 250a, it will be readily understood that buffer logic 250a may be used in like manner to test buffer logics and/or memory arrays within more than one memory module. Indeed, in some embodiments, simultaneous testing of more than one other memory module by buffer logic 250a may be carried out, perhaps as a way of evaluating interactions between multiple memory modules in simulated activity across point-to-point buses and/or through multiple buffer logics.

Figure 3:
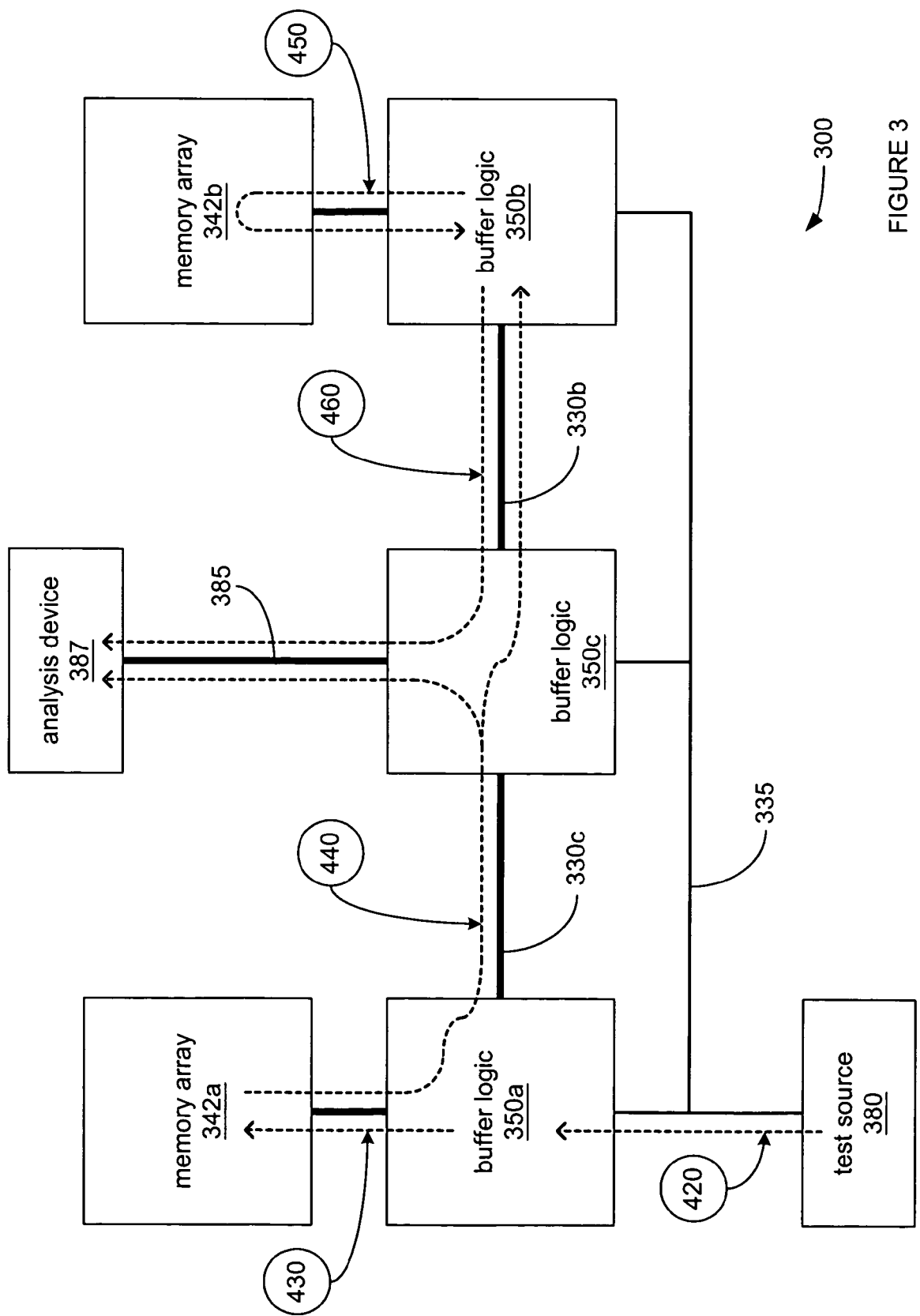
FIG. 3 is a block diagram of another embodiment employing a test assembly.
Figure 4:
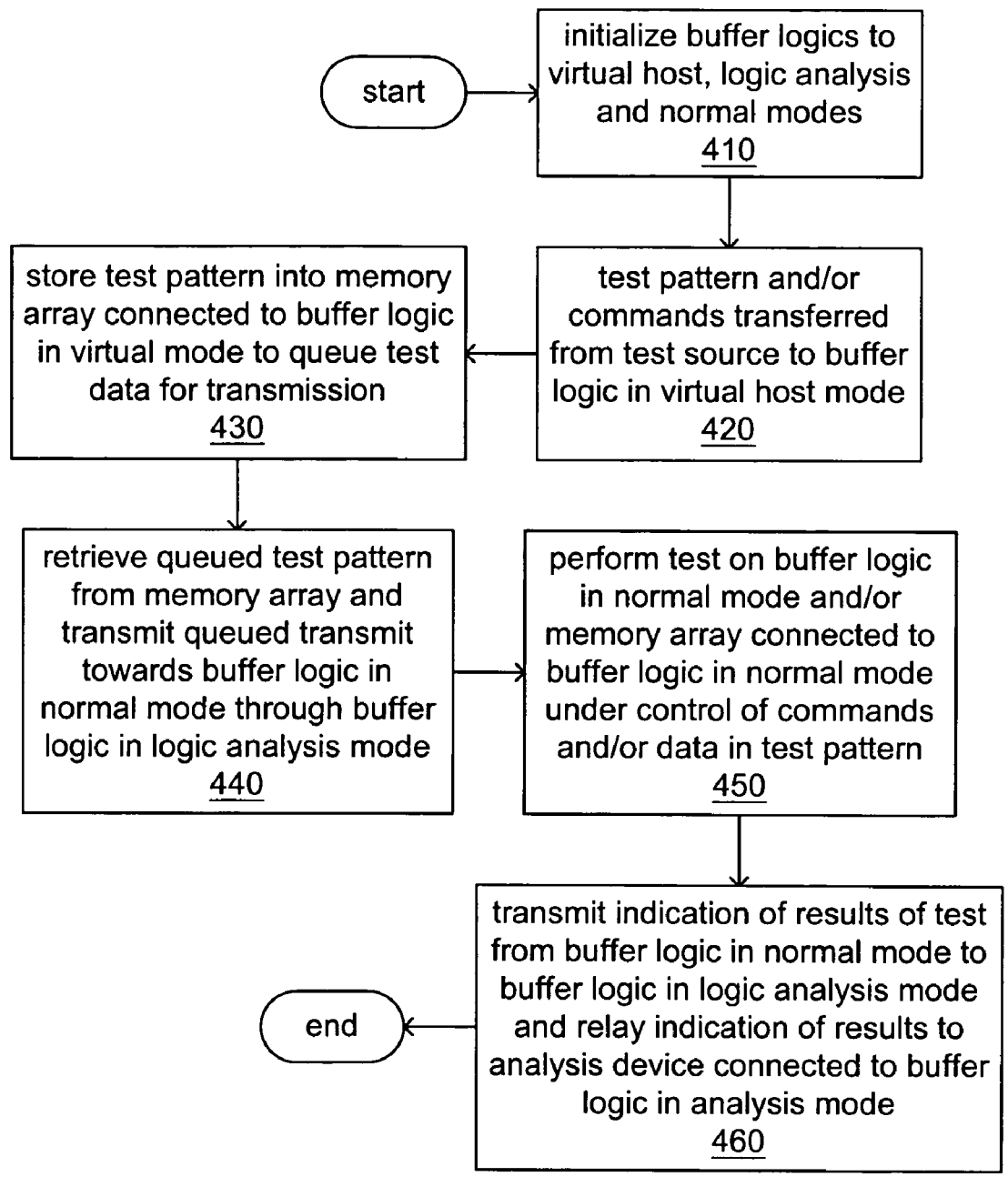
FIG. 4 is a flowchart an embodiment of employing a test assembly.

FIG. 3 is a simplified block diagram of another embodiment employing a test assembly, and FIG. 4 is an accompanying flowchart of an embodiment of testing with a test assembly. Test assembly 300 is largely analogous to test assembly 200 of FIG. 2, though the depiction and accompanying discussion of test assembly 300 has a differing focus. Test assembly 300 is made up, at least in part, of buffer logic 350a connected to accompanying memory array 342a, buffer logic 350b connected to accompanying memory array 342b, buffer logic 350c, analysis device 387 connected to buffer logic 350b via analysis link 385, point-to-point bus 330c connecting buffer logic 350a to buffer logic 350c, point-to-point bus 330b connecting buffer logic 350c to buffer logic 350b, and configuration bus 335 connecting together all of buffer logics 350a-c and test source 380.

Not unlike some embodiments discussed in reference to test assembly 200, point-to-point buses 330b and 330c of test assembly 300 may be of a dual simplex configuration in which there are two separate sets of signal lines, one set transmitting addresses, commands and/or data in one direction along each of point-to-point buses 330a-c, and another set transmitting addresses, commands and/or data in the other direction. Also, in some embodiments, configuration bus 335 is a two-wire serial bus of a type widely known and used in reading configuration data and programming configuration registers. As was the case with memory arrays 242a and 242b, memory arrays 342a and 342b are each made up of memory devices, such as DRAM ICs, arranged to provide at least one array of memory locations into which data may be stored.

In some embodiments, buffer logic 350b and memory array 342b, together, make up a memory module. Alternatively, other physical configurations are possible, including the attachment of all three of buffer logics 350a-c to a single circuitboard, with at least memory array 342b being socketed so as to allow memory array 342b to be releasably connected to buffer logic 350b, e.g., a DIMM in which the memory devices making up memory array 342b are attached to a circuitboard, but which does not incorporate buffer logic 350b. Such a physical configuration may arise in the form of a larger circuitboard to which all three of buffer logics 350a-c are attached, with each of buffer logics 350a-c being connected to a socket or other connector to which a memory array (such as one or the other of memory arrays 342a or 342b) may be releasably connected.

In some embodiments, buffer logics 350a and 350b are of substantially the same design, with both buffer logics 350a and 350b incorporating an interface by which each may be connected to a memory array. In such embodiments, both buffer logics 350a and 350b may incorporate logic to support carrying out tests of another buffer logic and/or of a memory array connected to another buffer logic, and in such embodiments, the use of such logic to support carrying out tests may be activated simply by programming or other mechanism. In alternate embodiments, all three of buffer logic 350a-c are of substantially the same design, with all three of buffer logics 350a-c incorporating an interface by which each may be connected to a memory array, as well as incorporating logic to support carrying out tests of other buffer logics and/or of memory arrays connected to other buffer logics. In such embodiments, where one of such buffer logics is connected to an analysis device, instead of being connected to a memory array (such as buffer logic 350c being connected to analysis device 387), enabling such a connection to such a diagnostic device in lieu of a memory array may entail programming or otherwise configuring that buffer logic, and in such embodiments, such a buffer logic may be designed such that the interface it incorporates to connect to a memory array is able to double as an interface to connect to a diagnostic device in lieu of a memory array, perhaps to keep the pin count of the buffer logic to a minimum. Therefore, in such alternative embodiments, analysis link 385 connects analysis device 387 to buffer logic 350c through the same interface that would otherwise be used to connect a memory array to buffer logic 350c. In still other embodiments, regardless of whether buffer logic 350c is of substantially the same design as buffer logics 350a-b, or not, analysis device 387 may be connected to buffer logic 350c through any of a number of possible linkages or other mechanisms, regardless of whether or not the same connection might otherwise be employed to connect to a memory array.

Referring now to FIG. 4 in conjunction with FIG. 3, in some embodiments, at 410, each of buffer logics 350a-c are initialized into distinct modes of operation in preparation for carrying out a test. In embodiments where either buffer logics 350a and 350b are of substantially the same design, or where all three of buffer logics 350a-c are of substantially the same design, the initialization of buffer logics 350a-c may entail programming or otherwise configuring one or more of buffer logics 350a-c to enter a distinct mode in preparation for the roles to be fulfilled by each of buffer logics 350a-c. More specifically, in some embodiments, buffer logic 350a may be programmed or configured to function in a "virtual host mode" in relation to one or both of buffer logics 350b and 350c, so as to allow buffer logic 350a to take the place of a memory controller (such as memory controllers 125 or 225 of FIG. 1 or 2, respectively) in initiating communication across point-to-point buses 330c and 330b, and/or in controlling buffer logics 350b and 350c. Similarly, buffer logic 350b may be programmed, configured or allowed to enter a default configuration to function in a so-called "normal mode" in which buffer logic 350b simply functions as buffer logic to support a memory array, namely memory array 342b, for carrying out normal memory operations, including storage and retrieval of data in response to commands received from across point-to-point bus 330b. Similarly, buffer logic 350c may be programmed or configured to function in "analysis mode" in which buffer logic 350c largely serves the role of a passive relay of transmissions between point-to-point buses 330b and 330c, while relaying a copy or other representation of at least some portion of this bus activity to a third device, such as analysis device 387, for observation and analysis. This programming or configuring of each of buffer logics 350a, 350b and/or 350c into distinct modes may, in some embodiments, be accomplished by a device (possibly test source 380) programming one or more of buffer logics 350a-c via configuration bus 335. Alternatively, one or more of buffer logics 350a-c may be programmed or otherwise configured to enter one of such distinct modes through strapping of one or more pins of an IC package by tying one or more pins to high or low voltage levels such that the state of such pin(s) may be checked at a specific time (such as reset or initialization) to determine what mode should be entered into.

At 420, a test pattern and/or commands for generating a test patterns are transferred across configuration bus 335 from test source 380 to buffer logic 350a, possibly along with a command to buffer logic 350a to carry out a test. At 430, a test pattern is stored by buffer logic 350a within memory array 342a, using memory array 342a as a buffer to queue the test pattern in preparation for transmission across point-to-point bus 330c. In some variations, this test pattern may simply be a copy of a test pattern received from test source 380 to be transmitted with substantially little change, and may incorporate commands for buffer logic 350b to execute and/or data for buffer logic 350b to simply store within memory array 342b for subsequent retrieval as part of testing. In other variations, this test pattern may be generated by buffer logic 350a, possibly under the control of commands received from test source 380, and/or possibly employing an algorithm either received from test source 380 or designed into buffer logic 350a.

At 440, the test pattern queued within memory array 342a is retrieved by buffer logic 350a from memory array 342a and is transmitted across both point-to-point buses 330b and 330c, as well as through buffer logic 350c. During this transfer, in some embodiments, buffer logic 350c may relay a copy of at least a portion of this transmission, or may provide other data related to this transmission, to analysis device 387 across analysis link 385. In some embodiments, there may be a need for buffer logic 350a to insert no-op instructions among instructions and/or null data among pieces of data within the queued test pattern as the test pattern is retrieved from memory array 342a and transmitted towards buffer logic 350b where characteristics of memory array 342a may impose delays in retrieving some or all of a test pattern as a result of a need by memory array 342a to be supported with various data maintenance operations such as refresh operations, etc.

At 450, buffer logic 350b is tested. In some embodiments, this testing may entail buffer logic 350b carrying out one or more commands incorporated into the test pattern transmitted at 440. In some variations, such commands may entail buffer logic 350b carrying out various forms of activity on point-to-point bus 330b, while in other variations, such commands may entail buffer logic 350b carrying out test on either logic within buffer logic 350b or on memory array 342b. In other embodiments, this testing may entail buffer logic 350b writing data to and retrieving data from memory array 342b, with such data possibly including patterns of binary values intended to test for various faults, such as address decoder, data line and/or memory cell malfunctions.

At 460, buffer logic 350b transmits an indication of the results of one or more tests towards buffer logic 350c, and buffer logic 350c relays either a copy or transmits some other form of indication of this transmission by buffer logic 350*b* to analysis device 387 through analysis link 385. In some embodiments, this indication of results may simply be bus activity that buffer logic 350*b* was commanded to carry out with buffer logic 350*c* employed to sample this activity and pass on at least a sample to analysis device 387. In other embodiments, this indication may be a code or other signal from buffer logic 350*b* that a test was conducted successfully, possibly accompanied by a data value derived from steps carried out during a test. In still other embodiments, this indication may be at least a portion of a test pattern that was received by buffer logic 350*b* and is then retransmitted by buffer logic 350*b* to permit the pattern to be checked for signs of an undesirable change indicating a fault. Various other indications of results of tests are possible as those skilled in the art will readily recognize.

Figure 5A:
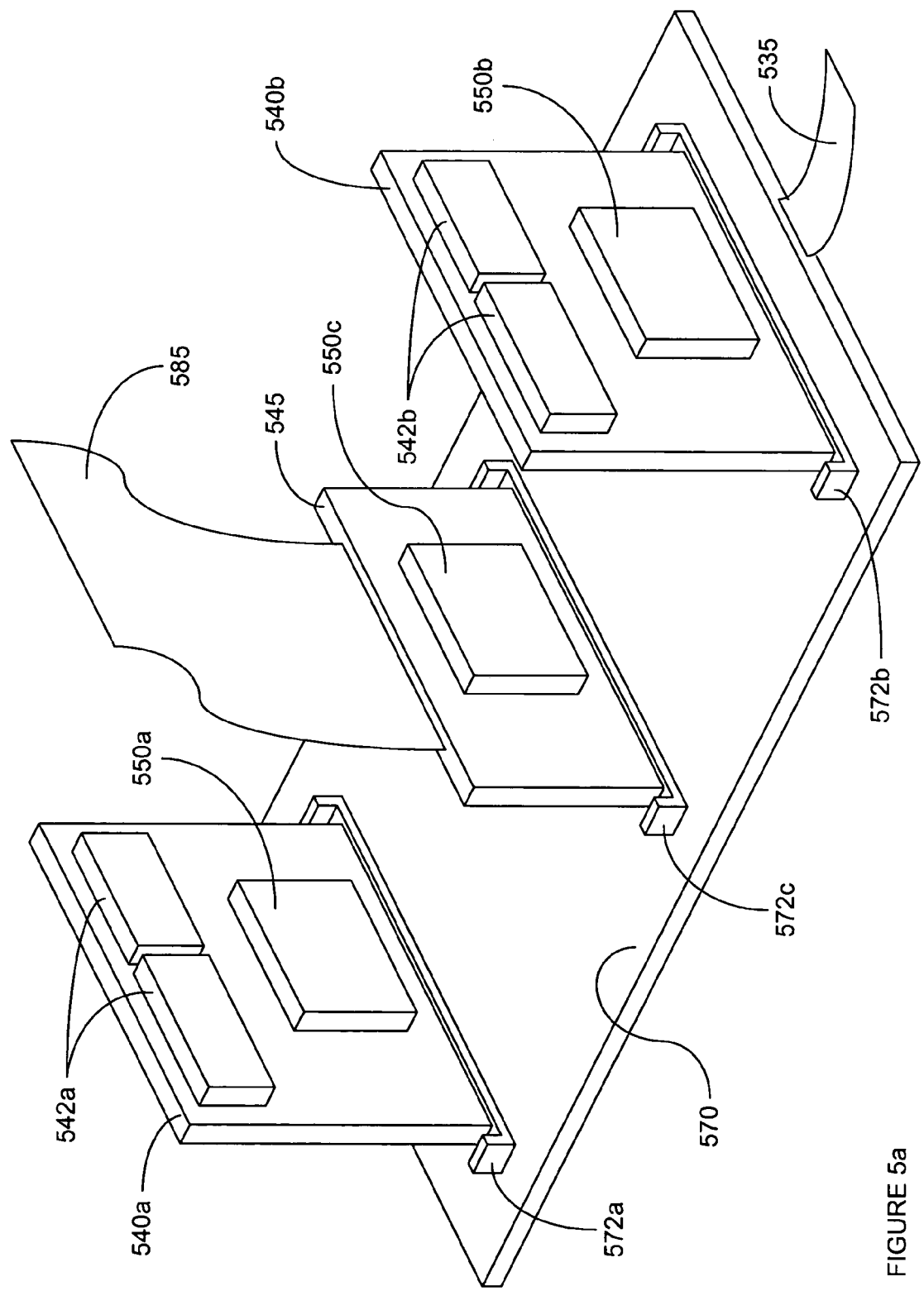
FIGS. 5a and 5b are perspective views of embodiments of memory components assembled for testing.
Figure 5B:
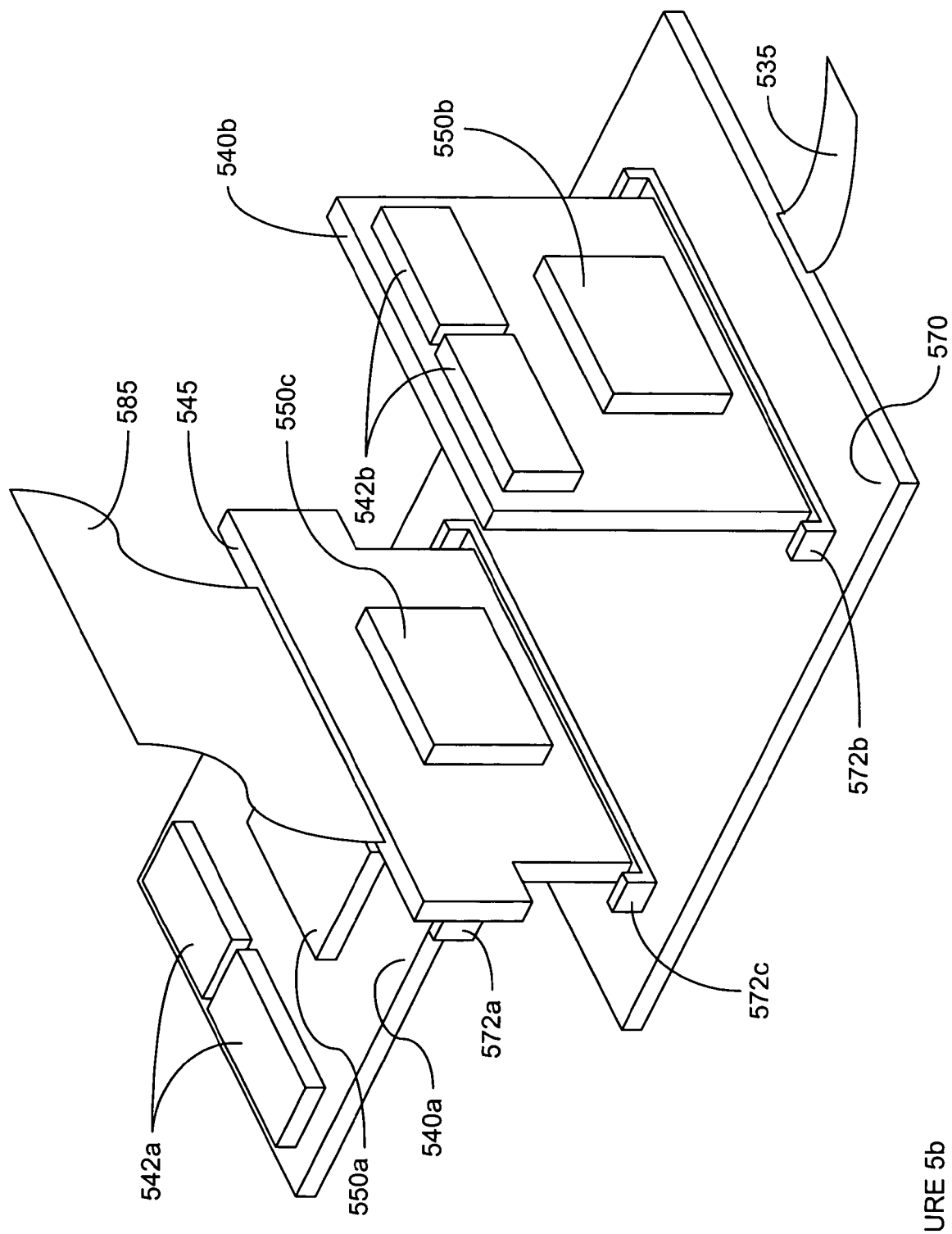

FIGS. 5*a* and 5*b* are perspective views of memory components assembled for testing. In a manner not unlike what has been discussed with reference to various embodiments, above, memory modules 540*a* and 540*b* are depicted as assembled together with analysis module 545, along with still other devices, to carry out tests.

In a manner analogous to some of the above discussion regarding memory modules 140*a* and 140*b* of FIG. 1 and memory modules 240*a* and 240*b* FIG. 2, each of memory modules 540*a* and 540*b* are made up, at least in part, of a circuitboard to which a buffer logic and memory array have been attached. Specifically, memory module 540*a* is made up, at least in part, of buffer logic 550*a* and memory array 540*a* connected to each other via connections routed through a circuitboard to which both buffer logic 550*a* and memory array 540*a* are attached. Memory module 540*b* is similarly made up of buffer logic 550*b* and memory array 542*b*. Also, in a manner analogous to some of the above discussion regarding analysis modules 145 and 245, analysis module 545 is made up, at least in part, of buffer logic 550*c* attached to a circuitboard with analysis link 585 electrically connected to buffer logic 550*c* (possibly to the same interface incorporated into buffer logic 550*c* to which a memory array might otherwise be connected) to provide a connection to a diagnostic device (not shown).

In both FIGS. 5*a* and 5*b*, memory modules 540*a* and 540*b*, and analysis module 545 are connected to circuitboard 570 to create point-to-point bus connections between memory modules 540*a* and 540*b*, and analysis module 545 that are analogous to the point-to-point connections discussed at length, above. In some embodiments, as depicted in FIG. 5*a*, all of memory modules 540*a* and 540*b*, and analysis module 545 are connected to circuitboard 570 via connectors 572*a*, 572*b* and 572*c*, respectively, thereby establishing a point-to-point bus connecting buffer logic 550*a* of memory module 540*a* to buffer logic 550*c* of analysis module 545, and establishing a point-to-point bus connecting buffer logic 550*c* of analysis module 545 to buffer logic 550*b* of memory module 540*b*. These connections to circuitboard 570 also provides all of memory modules 540*a* and 540*b*, and analysis module 545 with access to power and with connections to configuration bus 535 which further connects to a test source (not shown) and/or other devices for other configuration and/or testing purposes. Other embodiments, as depicted in FIG. 5*b*, are largely similar to what is depicted in FIG. 5*a*, with the exception of circuitboard 570 having fewer connectors (i.e., not having connector 572*a* thereupon), and with the exception that analysis module 545 is interposed between memory module 540*a* and circuitboard 570 so as to break into the point-to-point bus that would otherwise be established directly between memory modules 540*a* and 540*b* if memory module 540*a* were to be connected directly to circuitboard 570 at connector 572*c*. By breaking into that point-to-point bus, analysis module interposes buffer logic 550*c* between buffer logics 550*a* and 550*b*, thus establishing a point-to-point bus between buffer logics 550*a* and 550*c*, and between 550*c* and 550*b*.

In still other embodiments, circuitboard 570 may be a circuitboard of a computer system in which connectors 572*c* and 572*b* (and connector 572*a*, if present) are used to connect memory modules for purposes of providing a memory system for use by the computer system. Analysis module 545 may be substituted for a memory module, or interposed between memory modules, depending on which of the two depicted physical configurations of analysis module 545 is employed, to allow testing of components of such a memory system as installed within the computer system in a manner discussed with regard to both FIGS. 1 and 2, above.

Figure 6:
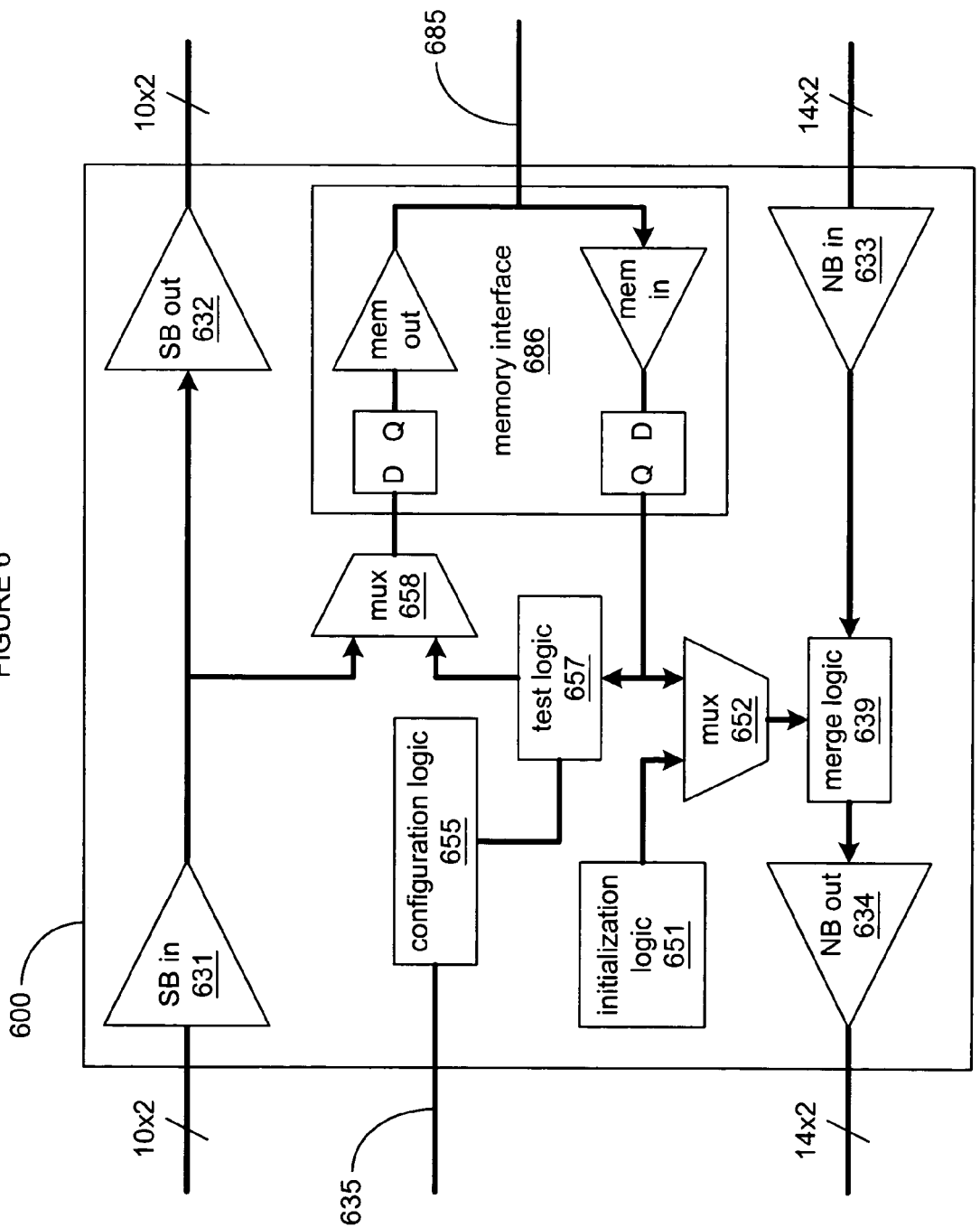
FIG. 6 is a block diagram of an embodiment employing a buffer logic.

FIG. 6 is a simplified block diagram of a buffer logic that may be employed to connect a memory array to one or two point-to-point buses. Buffer logic 600 is made up, at least in part, of Southbound input 631 and Northbound output 634 providing an interface to one point-to-point bus, Southbound output 632 and Northbound input 633 providing an interface to another point-to-point bus, memory interface 686 providing an interface to bus 685 to connect to either a memory array or a diagnostic device, configuration logic 655 providing an interface to configuration bus 635, initialization logic 651 to aid in initializing buffer logic 600 for use, and test logic 657 to enable buffer logic 600 to participate in testing either another buffer logic or a memory array attached to another buffer logic, as will be explained in detail.

In normal use, where a memory array is connected to bus 685 and buffer logic 600 is employed to make that memory array accessible to a memory controller of a computer system, Southbound input 631 and Northbound output 634 are connected to a point-to-point bus that is either directly connected to the memory controller or leads towards the memory controller (perhaps through other buffer logics and point-to-point buses along the way). Southbound output 632 and Northbound input 633 provide an interface to a point-to-point bus connecting to another device (such as another buffer logic) that is further away from the memory controller than buffer logic 600 (i.e., "further South" of the memory controller), if such a device is present. If indeed such a "more Southerly" device is present, the signal lines of a point-to-point bus connected to Southbound output 632 would be connected to the Southbound input of the more Southerly device, and the signal lines of that same point-to-point bus that are connected to Northbound input 633 would be connected to the Northbound output of the more Southerly device.

Upon being powered up or reset for normal use, initialization logic 651 accesses Northbound output 634 through multiplexer 652 and merge logic 639 to aid in initiating communications with the memory controller. The memory controller may access buffer logic 600 via configuration bus 635 to retrieve information from configuration logic 655 concerning characteristics of buffer logic 600 and/or the memory array connected to buffer logic 600 via bus 685. Also during normal use, addresses, commands and/or data received from the memory controller via Southbound input 631 that are directed to buffer logic 600 are passed through multiplexer 658 and onward to memory interface 686 to carry out whatever read, write or other operation is appropriate on the memory array connected to memory interface 686. Furthermore, data retrieved from that memory array through memory interface 686 is passed through multiplexer 652 and merged into the path of data that may received from another buffer logic connected via a point-to-point bus to Southbound output 632 and Northbound input 633, for transmission through Northbound output 634 and onward to the memory controller. Addresses, commands and/or data received from the memory controller via Southbound input 631 that are not directed to buffer logic 600 are passed onward towards a more Southerly buffer logic through Southbound output 632, and similarly, data received from a more Southerly buffer logic via Northbound input 633 are passed onward to the memory controller through Northbound output 634.

In some embodiments, the point-to-point buses to which buffer logic connects are of a dual simplex configuration with the Southbound portions of both point-to-point buses (i.e., the signal lines of the point-to-point buses connected to Southbound input 631 and Southbound output 632) being made up of 10 pairs of differential signal lines, and the Northbound portions of both point-to-point buses (i.e., the signal lines of the point-to-point buses connected to Northbound input 633 and Northbound output 634) being made up of 10 to 14 such differential pairs. The exact quantity of differential pairs making up the Northbound portions of the point-to-point buses may be dependent upon whether or not some form of parity error checking or ECC memory algorithm is employed such that there may be a need for more signal lines transferring data to a memory controller versus the point-to-point buses transferring data away from the memory controller. Also, in some embodiments, configuration bus 635 is a two-wire serial bus of one of the various types of such buses widely known and used in the transfer of configuration data and in the setting of configurations of numerous devices, such as SMbus, and configuration logic 655 is designed to interact with the protocol of such a two-wire serial bus.

In some embodiments, when buffer logic 600 is employed to carry out a test of another buffer logic or a memory array attached to another buffer logic, the normal arrangement of point-to-point bus connections, including the strictly adhered to "Northbound" and "Southbound" organization of direction of transfers is changed. This change may be due to a combination of the test assembly of which buffer logic 600 is a part not having a memory controller and buffer logic 600 not being designed to initiate communications (and thereby, masquerade as a memory controller) using Southbound output 632, in the same way that buffer logic 600 is able to initiate communications using Northbound output 634. For this reason, Southbound output 632 and Northbound input 633 may be left unconnected, and both Southbound input 631 and Northbound input 634 are connected at least towards the buffer logic to which test patterns are to be transmitted, if not directly connected to that other buffer logic. In essence, the Northbound and Southbound point-to-point input and output orientation of buffer logic 600 is reversed so that buffer logic 600 may mimic some of the behavior of a memory controller (for example, memory controller 125 or 225 of FIG. 1 or 2).

Upon being powered up or reset for testing either another buffer logic or a memory array connected to another buffer logic, initialization logic 651 accesses Northbound output 634 through multiplexer 652 and merge logic 639 to aid in initiating communications with the other buffer logic. A test source device (not shown) may accesses buffer logic 600 via configuration bus 635 to retrieve information from configuration logic 655 concerning characteristics of buffer logic 600 and to provide buffer logic 600 with a test pattern and/or commands for generating a test pattern to use in testing the other buffer logic, which configuration logic 655 passes onward to test logic 657. Whether test logic 657 receives a test pattern and/or commands from a test source connected to configuration bus 635 through configuration logic 655, test logic 657 writes a test pattern into a memory array connected to memory interface 686 through bus 685 using that memory as a buffer to queue the test pattern in preparation for transmission to the other buffer logic. With the test pattern now queued in the memory array, test logic 657 causes the queued test pattern to be retrieved from the memory array and sent through multiplexer 652, merge logic 639 and Northbound output 634 onward to the other buffer logic.

The invention has been described in some detail with regard to various possible embodiments. It is evident that numerous alternatives, modifications, variations and uses will be apparent to those skilled in the art in light of the foregoing description. It will be understood by those skilled in the art that the present invention may be practiced in support of many possible types of graphics hardware memory devices employing any of a number of possible types of graphics data. It will also be understood by those skilled in the art that the present invention may be practiced in support of electronic devices other than computer systems such as audio/video entertainment devices, controller devices in vehicles, appliances controlled by electronic circuitry, etc.

What is claimed is:

1. An electronic system comprising:
   a first memory module having a first memory array and a first buffer logic coupled to the first memory array;
   a second memory module having a second memory array and a second buffer logic coupled to the second memory array; and
   an analysis module having a third buffer logic and an analysis device coupled to the third buffer logic, wherein the analysis module is interposed between the second buffer logic and the first buffer logic,
   wherein the second buffer logic transmits a test pattern through the third buffer logic to the first buffer logic to carry out a test of the first memory module independently of a memory controller, and the analysis device analyzes a result of the test transmitted by the first buffer logic.

2. The electronic system of claim 1, further comprising:
   the memory controller coupled to the second buffer logic; and
   a processor coupled to the memory controller to execute instructions stored in the second memory array of the second memory module under the control of the memory controller.

3. The electronic system of claim 2, wherein the memory controller transmits a command to the second buffer logic under the control of the processor to cause the second buffer logic to carry out a test of the first memory module.

4. The electronic system of claim 3, further comprising a memory bus coupling together the memory controller, the first memory module and the second memory module, and wherein the test pattern is transmitted across the memory bus.

5. The electronic system of claim 1, further comprising a test source coupled to the second buffer logic, wherein the test source transmits a command to the second buffer logic to cause the second buffer logic to carry out a test of the first memory module.

6. The electronic system of claim 5, further comprising a serial bus coupling the second buffer logic to the test source, wherein the command is transmitted by the test source across the serial bus to the second buffer logic.

7. The electronic system of claim 5, wherein the test pattern is received by the second buffer logic from the test source and wherein the second buffer logic stores the test pattern in the second memory array in preparation for transmitting the test pattern to the first buffer logic of the first memory module.

8. The electronic system of claim 1, wherein the test pattern is generated by the second buffer logic in response to commands received by the second buffer logic and wherein the second buffer logic stores the test pattern in the second memory array in preparation for transmitting the test pattern to the first buffer logic of the first memory module.

9. The electronic system of claim 1, wherein the test pattern incorporates commands for the first buffer logic to carry out.

10. The electronic system of claim 1, wherein the test pattern incorporates a deliberately created error to elicit an expected action on the part of the first memory module upon encountering the deliberately created error.

11. The electronic system of claim 1, further comprising:
a first point-to-point bus coupling the first buffer logic of the first memory module to the third buffer logic; and
a second point-to-point bus coupling the second buffer logic of the second memory module to the third buffer logic.

12. The electronic system of claim 1, wherein the third buffer logic provides an indication to the analysis device of the transmission of the test pattern by the second buffer logic to the first buffer logic, and wherein the third buffer logic provides an indication to the analysis device of a signal transmitted by the first buffer logic in response to the carrying out of a test by the second buffer logic and indicating a status of the test.

13. The electronic system of claim 1, wherein all three of the first buffer logic, the second buffer logic and the third buffer logic are integrated circuits of substantially similar design, and wherein the interface of the third buffer logic to couple the third buffer logic to the analysis device is of substantially the same design as both a corresponding interface of the first buffer logic to couple the first buffer logic to the first memory array, and a corresponding interface of the second buffer logic to couple the second buffer logic the second memory array.

* * * * *